US009613937B2

(12) United States Patent
Kobayakawa et al.

(10) Patent No.: US 9,613,937 B2
(45) Date of Patent: Apr. 4, 2017

(54) LED MODULE

(71) Applicant: ROHM CO., LTD., Kyoto-shi, Kyoto (JP)

(72) Inventors: Masahiko Kobayakawa, Kyoto (JP); Hidekazu Toda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/793,092

(22) Filed: Jul. 7, 2015

(65) Prior Publication Data

US 2015/0311184 A1 Oct. 29, 2015

Related U.S. Application Data

(63) Continuation of application No. 13/640,177, filed as application No. PCT/JP2011/060217 on Apr. 27, 2011, now Pat. No. 9,093,294.

(30) Foreign Application Priority Data

Apr. 27, 2010 (JP) ................. 2010-101949

(51) Int. Cl.
*H01L 25/075* (2006.01)
*H01L 33/62* (2010.01)
*H01L 33/48* (2010.01)

(52) U.S. Cl.
CPC ........ *H01L 25/0753* (2013.01); *H01L 33/486* (2013.01); *H01L 33/62* (2013.01); *H01L 2224/32245* (2013.01); *H01L 2224/48247* (2013.01); *H01L 2224/48465* (2013.01); *H01L 2224/73265* (2013.01)

(58) Field of Classification Search
None
See application file for complete search history.

(56) References Cited

U.S. PATENT DOCUMENTS

D590,358 S     4/2009   Miyashita et al.
7,709,854 B2   5/2010   Bando et al.
7,888,699 B2   2/2011   Oshio et al.
(Continued)

FOREIGN PATENT DOCUMENTS

JP   62-128590   6/1987
JP   62-185381   8/1987
(Continued)

*Primary Examiner* — Robert Carpenter
(74) *Attorney, Agent, or Firm* — Hamre, Schumann, Mueller & Larson, P.C.

(57) ABSTRACT

An LED module 100 includes LED chips 21, 22 spaced apart from each other, and an LED chip 23 offset from a straight line connecting the LED chips 21 and 22 and located between the LED chips 21, 22 in the direction in which the LED chips 21, 22 are spaced. The module further includes a lead 31 with a bonding portion 31*a* and a mounting terminal surface 31*d*, a lead 32 with a bonding portion 32*a* and a mounting terminal surface 32*d*, and a lead 33 with a bonding portion 33*a* and a mounting terminal surface 33*d*. The mounting terminal surfaces 31*d*, 32*d*, 33*d* are flush with each other. Light from the LED chips 21, 22, 23 is emitted in the direction in which the mounting terminal surfaces 31*d*, 32*d* and 33*d* extend. Thus, light of different colors properly mixed can be emitted from a compact LED module.

20 Claims, 6 Drawing Sheets

(56) References Cited

U.S. PATENT DOCUMENTS

| | | | |
|---|---|---|---|
| 2008/0041625 A1* | 2/2008 | Cheong | H01L 33/60 174/521 |
| 2008/0128732 A1 | 6/2008 | Haruna et al. | |
| 2008/0151143 A1* | 6/2008 | Li | G02F 1/133603 349/68 |
| 2009/0134408 A1 | 5/2009 | Park et al. | |
| 2009/0242927 A1 | 10/2009 | Kobayakawa et al. | |
| 2010/0207133 A1 | 8/2010 | Taguchi | |

FOREIGN PATENT DOCUMENTS

| | | |
|---|---|---|
| JP | 2006-222382 | 8/2006 |
| JP | 2006-253551 | 9/2006 |
| JP | 2007-280983 | 10/2007 |
| JP | 2008-112966 | 5/2008 |
| JP | 2008-300573 | 12/2008 |
| JP | 2009-21417 | 1/2009 |
| JP | 2009-260222 | 11/2009 |

\* cited by examiner

LED MODULE

This application is a Continuation of U.S. Ser. No. 13/640,177, filed Oct. 9, 2012, which is a National Stage Application of PCT/JP2011/060217, filed Apr. 27, 2011, which applications are incorporated herein by reference

TECHNICAL FIELD

The present invention relates to an LED module of a so-called side-view type.

BACKGROUND ART

FIG. 7 shows an example of a conventional LED module. The LED module 900 illustrated in the figure includes leads 91A and 91B, an LED chip 92, and a case 93 and is configured as a so-called side-view type. The leads 91A and 91B each comprises a plate made of e.g. an alloy of Cu or Ni plated with Ag. The LED chip 92 is mounted on the lead 91A. The LED chip 92 is configured to emit e.g. blue light. The LED chip 92 and the lead 91B are connected to each other with a wire 95. The case 93 is made of e.g. white resin and surrounds the four sides of the LED chip 92. Portions of the leads 91A and 91B that are exposed from the case 93 serve as mounting terminals 91Aa and 91Ba. The space surrounded by the case 93 is filled with light-transmitting resin, not shown. The light-transmitting resin is made of e.g. a transparent resin mixed with a fluorescent substance. The fluorescent substance emits e.g. yellow light when excited by the light emitted from the LED chip 92. The blue light from the LED chip 92 and the yellow light from the fluorescent substance mix with each other, so that white light is emitted from the LED module 900.

One of the means for increasing the application of the LED module 900 is to configure the LED module to emit light of a plurality of colors, instead of a single color. For this purpose, it is necessary to provide a plurality of LED chips 92 that emit light of different wavelengths from each other. However, in the LED module 900 of a side-view type, the height (the dimension in the vertical direction in the figure) is often limited to a certain value. Thus, it is desirable to arrange the LED chips 92 as close to each other as possible. Further, when the LED chips 92 are too far away from each other, light of different colors cannot sufficiently mix with each other when all the LED chips 92 are turned on.

Patent Document: JP-A-2006-253551

SUMMARY OF THE INVENTION

Problems to be Solved by the Invention

The present invention has been conceived in view of the foregoing situation. It is therefore an object of the present invention to provide an LED module that is configured to properly mix light of a plurality of colors for emission and that can be made compact.

Means for Solving the Problems

An LED module provided according to a first aspect of the present invention comprises: at least one LED chip; at least one lead including a bonding portion on which the LED chip is mounted and a mounting terminal surface for surface mounting; and a case covering a part of the lead. Light from the LED chip is emitted in the direction in which the mounting terminal surface extends. In an embodiment, the LED module includes a first and a second LED chips spaced apart from each other, and a third LED chip arranged at a position that is offset from a straight line connecting the first and the second LED chips, where the above-mentioned position is between the first LED chip and the second LED chip in a spacing direction in which the first and the second LED chips are spaced apart from each other.

In another embodiment according to a first aspect of the present invention, there is provided an LED module comprises: a first and a second LED chips spaced apart from each other; a third LED chip arranged at a position that is offset from a straight line connecting the first and the second LED chips, the above-mentioned position being between the first LED chip and the second LED chip in a spacing direction in which the first and the second LED chips are spaced apart from each other; a first lead including a first bonding portion on which the first LED chip is mounted and a first mounting terminal surface for surface-mounting; a second lead including a second bonding portion on which the second LED chip is mounted and a second mounting terminal surface for surface-mounting; and a third lead including a third bonding portion on which the third LED chip is mounted and a third mounting terminal surface for surface-mounting. The first through the third mounting terminal surfaces are flush with each other, and light from each of the first through the third LED chips is emitted in a direction in which the first through the third mounting terminal surfaces extend.

According to a second aspect of the present invention, in the LED module of the first aspect, one of the first and the second LED chips emits blue light, the other one of the first and the second LED chips emits green light, and the third LED chip emits red light.

According to a third aspect of the present invention, the LED module of the second aspect further comprises a third wire including an end bonded to the third LED chip and extending across the straight line connecting the first and the second LED chips.

According to a fourth aspect of the present invention, the LED module of the second or third aspect further comprises a first wire including an end bonded to the first LED chip and extending away from the third LED chip in the spacing direction.

According to a fifth aspect of the present invention, in the LED module of any one of the first through fourth aspects, the third lead comprises a detour port ion extending in the spacing direction and passing at least one of the first and the second LED chips, where the detour portion is provided between the third bonding portion and the third mounting terminal surface.

According to a sixth aspect of the present invention, in the LED module of any one of the first through fifth aspects, the first lead comprises a first wire bonding portion to which another end of the first wire is bonded and a groove positioned between the first bonding portion and the first wire bonding portion.

According to a seventh aspect of the present invention, the LED module of any one of the first through sixth aspects further comprises a Zener diode arranged opposite to the third LED chip with respect to the first LED chip in the spacing direction, where the Zener diode is connected in series to the first LED chip.

According to an eighth aspect of the present invention, the LED module of any one of the first through seventh aspects further comprises: a first additional wire including an end bonded to the first LED chip; a fourth lead including a fourth wire bonding portion to which another end of the first additional wire is bonded and also including a fourth mounting terminal surface for surface mounting; a second additional wire including an end bonded to the second LED chip; a fifth lead including a fifth wire bonding portion to which another end of the second additional wire is bonded and also including a fifth mounting terminal surface for surface mounting; a third wire including an end bonded to the third LED chip; and a sixth lead including a sixth wire bonding portion to which another end of the third wire is bonded and also including a sixth mounting terminal surface for surface mounting. The first through sixth mounting terminal surfaces are flush with each other.

According to a ninth aspect of the present invention, in the LED module of the eighth aspect, the case is provided with a recess, and the first through sixth leads include surfaces opposite to the first through the sixth mounting terminal surfaces, respectively. The recess of the case is configured to expose at least a part of each of the opposite surfaces of of the first through the sixth leads, as viewed from a side opposite to a direction in which the first through the sixth mounting terminal surfaces face.

According to a tenth aspect of the present invention, in the LED module of any one of the first through ninth aspects, the case is provided with a reflector surrounding the first through third LED chips.

According to an eleventh aspect of the present invention, in the LED module of the tenth aspect, the reflector surrounds a region filled with light-transmitting resin covering the first through third LED chips.

Other features and advantages of the present invention will become more apparent from detailed description given below with reference to the accompanying drawings.

MODE FOR CARRYING OUT THE INVENTION

Figure 1:
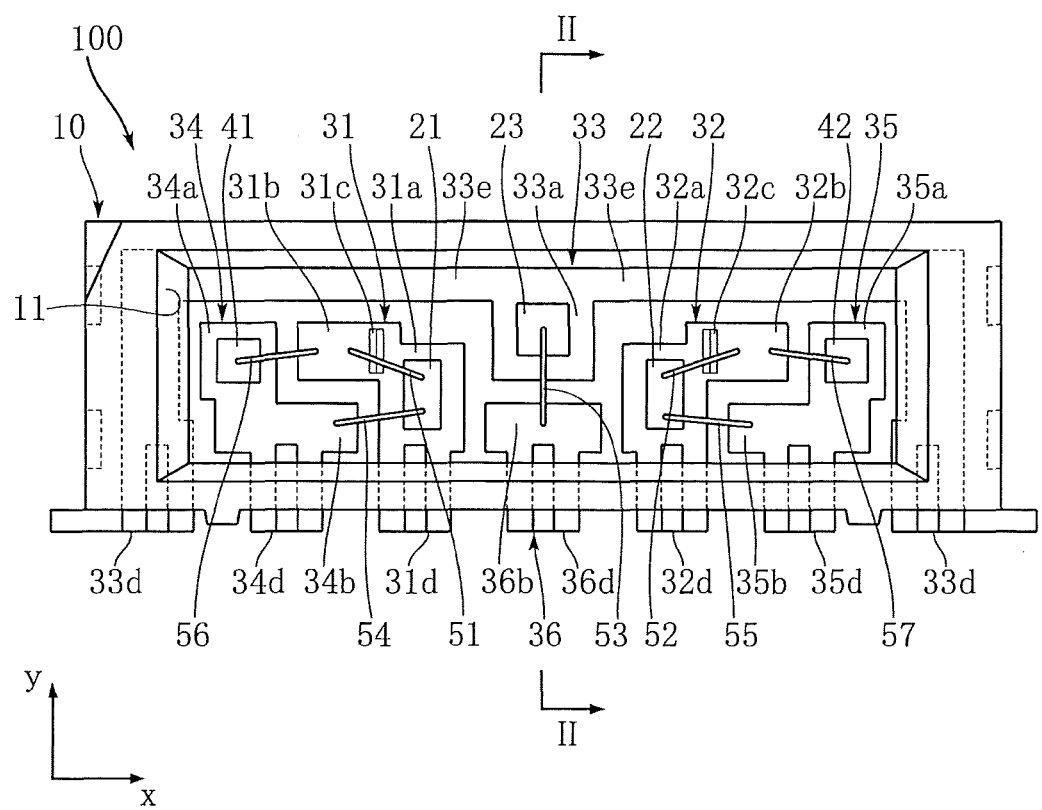
FIG. 1 is a front view of an example of LED module according to the present invention.
Figure 2:
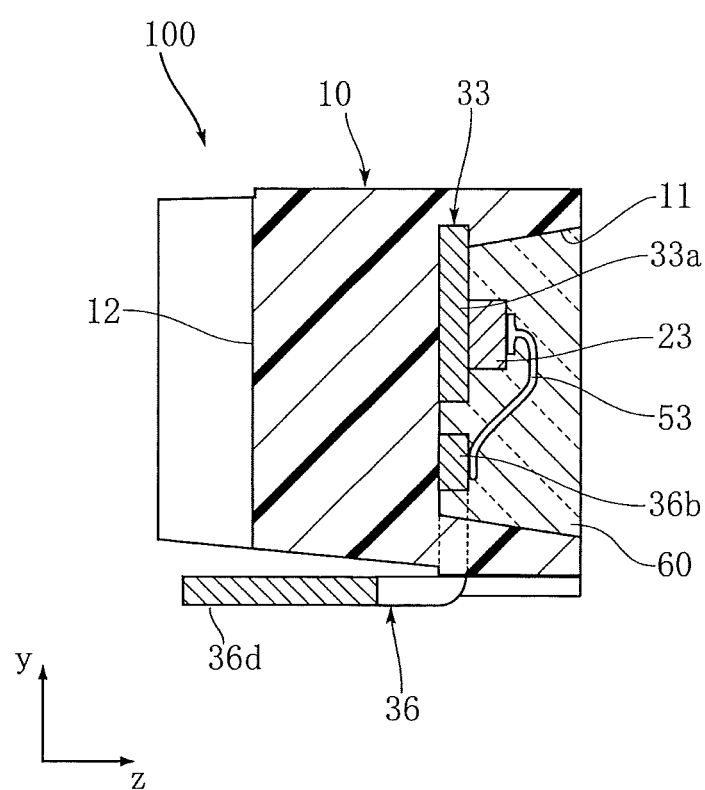
FIG. 2 is a sectional view taken along lines II-II in FIG. 1.

Preferred embodiments of the present invention are described below with reference to the accompanying drawings.

FIGS. 1-6 show an example of LED module according to the present invention. The LED module 100 of this embodiment includes a case 10, LED chips 21, 22 and 23, leads 31, 32, 33, 34, 35 and 36, Zener diodes 41 and 42, wires 51, 52, 53, 54, 55, 56 and 57, and light-transmitting resin 60. The LED module 100 is configured as a side-view type that emits light mainly in the direction z, and its dimensions are e.g. about 6.9 mm in the direction x, about 2.15 mm in the direction y and about 2.2 mm in the direction z. The LED module 100 is made by insert molding. Note that illustration of the light-transmitting resin 60 is omitted in FIG. 1.

Figure 3:
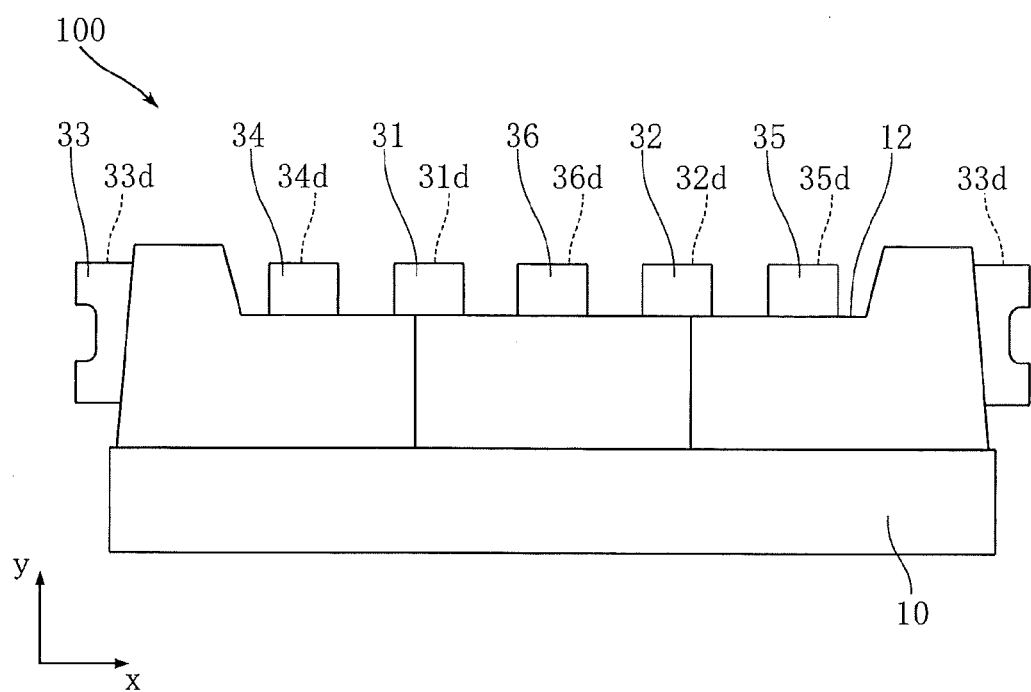
FIG. 3 is a plan view of the example of the LED module according to the present invention.
Figure 4:
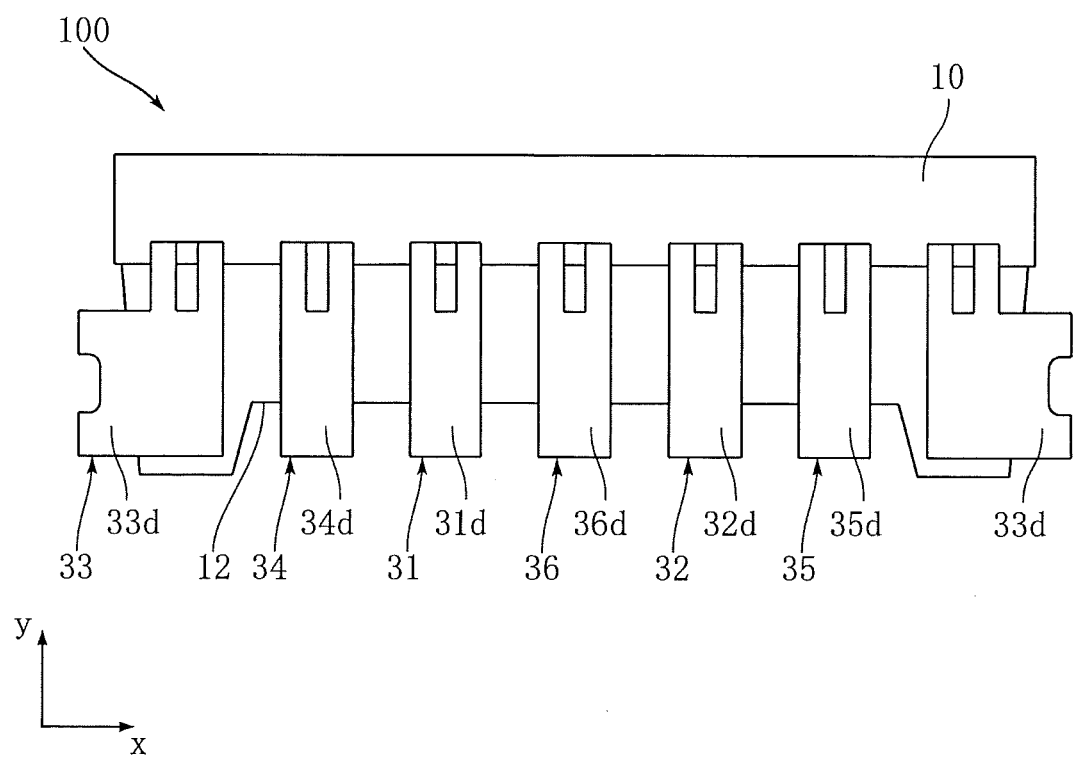
FIG. 4 is a bottom view of the example of the LED module according to the present invention.
Figure 5:
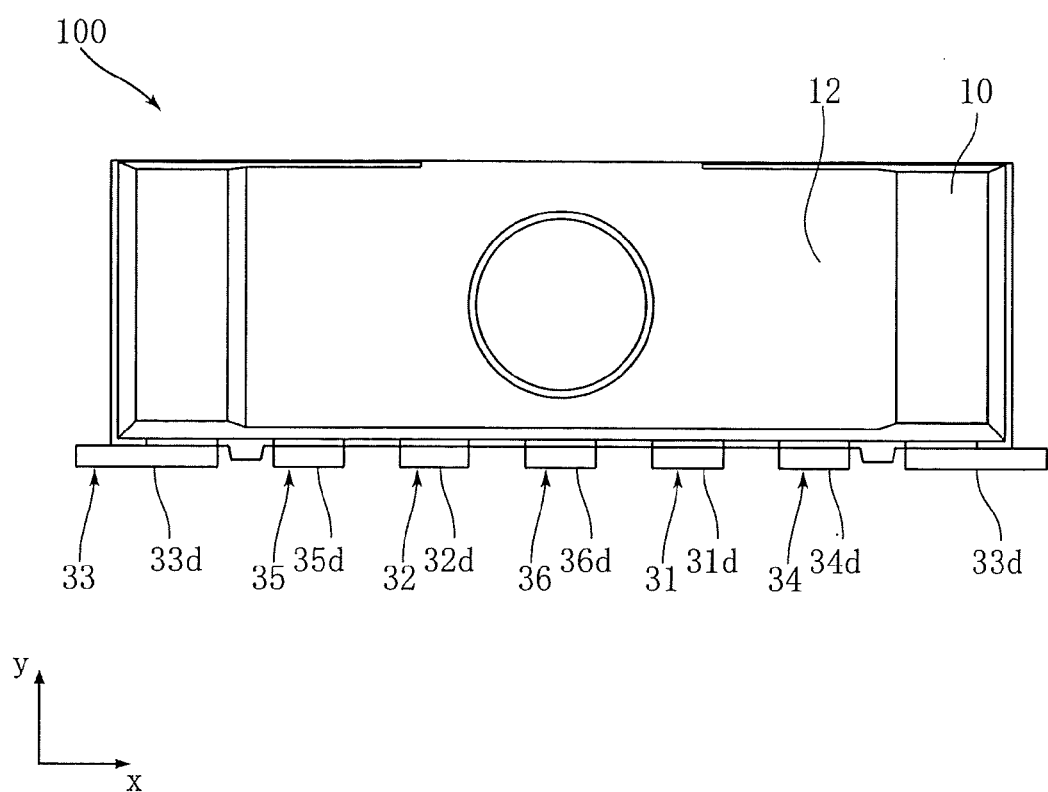
FIG. 5 is a rear view of the example of the LED module according to the present invention.

The case 100 provides the base of the LED module 100 and is made of e.g. white resin. The case has a reflector 11 and a recess 12. The reflector 11 surrounds the LED chips 21, 22 and 23. Light emitted from the LED chips 21, 22 and 23 in the direction x and the direction y is reflected by the reflector to travel in the direction z. The region surrounded by the reflector 11 has dimensions of about 5.4 mm in the direction x and about 1.6 mm in the direction y. As shown in FIGS. 3-5, the recess 12 is provided on a side of the case 10 opposite to the light-emitting side in the direction y. The recess 12 has a uniform cross section as viewed in the direction z. The cross sectional shape is generally a flat trapezoid, elongated in the direction x.

The LED chips 21, 22 and 23 are the light source of the LED module 100. The LED chip 21 corresponds to the first LED chip defined in the present invention. The LED chip 21 has a laminated structure made up of an n-type semiconductor layer mainly composed of e.g. GaN, an active layer and a p-type semiconductor layer and emits blue light. The LED chip 22 corresponds to the second LED chip defined in the present invention. The LED chip 22 has a laminated structure made up of an n-type semiconductor layer mainly composed of e.g. GaN, an active layer and a p-type semiconductor layer and emits green light . The LED chip 23 corresponds to the third LED chip defined in the present invention. The LED chip 23 has a laminated structure made up of an n-type semiconductor layer mainly composed of e.g. Al, GaAs or GaAsP, an active layer and a p-type semiconductor layer and emits red light. In this embodiment, the LED chips 21 and 22 are configured as a two-wire type, whereas the LED chip 23 is configured as a single-wire type.

The Zener diodes 41 and 42 prevent application of excessive reverse voltage to the LED chips 21 and 22, respectively, and allow current to flow in a reverse direction only when an excessive reverse voltage above a certain value is applied.

The leads 31, 32, 33, 34, 35 and 36 serve to support the LED chips 21, 22, 23 and supply electric power. Each of the leads may comprise a plate made of e.g. an alloy of Cu or Ni plated with Ag. Each lead 31, 32, 33, 34, 35, 36 is partially covered by the case 10, and the remaining portion is exposed out of the case 10.

The lead 31 corresponds to the first lead defined in the present invention and includes a bonding portion 31*a*, a wire bonding portion 31*b*, a groove 31*c* and a mounting terminal surface 31*d*. As shown in FIG. 1, the bonding portion 31*a*, the wire bonding portion 31*b* and the groove 31*c* are arranged in the region surrounded by the reflector 11 at a position shifted slightly to the left from the center in the direction x.

Figure 6:
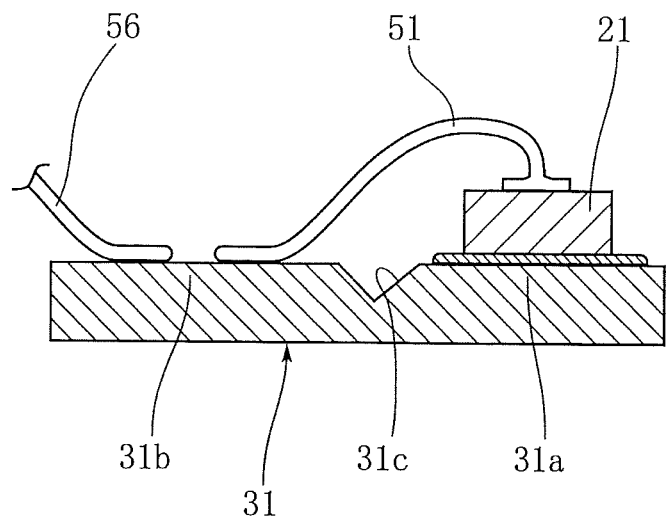
FIG. 6 is a schematic sectional view showing a groove of the LED module according to the present invention.
Figure 7:
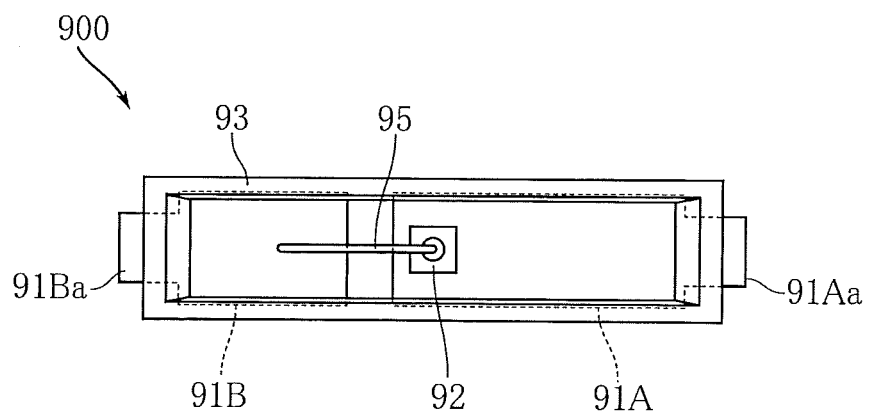
FIG. 7 is a front view of an example of conventional LED module.

To the bonding portion 31*a* is die-bonded the LED chip 21. The wire bonding portion 31*b* is on the left side of the bonding portion 31*a* in the direction x. To this wire bonding portion are bonded an end of the wire 51 and an end of the wire 56. The other end of the wire 51 is bonded to the LED chip 21. The other end of the wire 56 is bonded to the Zener diode 41. The groove 31*c* is positioned between the bonding portion 31*a* and the wire bonding portion 31*b*. The groove 31*c* extends in the direction y as shown in FIG. 1 and has e.g. a triangular cross-sectional shape as shown in FIG. 6.

Of the lead 31, the portion projecting from the case 10 downward in the direction y in FIG. 1 is bent to extend in the direction z, as shown in FIGS. 1, 2, 4 and 5. Of this portion, the surface that faces downward in the direction y in FIG. 1 is the mounting terminal surface 31*d*. The bent portion extends to overlap the recess 12 of the case 10 in the direction z.

The lead 32 corresponds to the second lead defined in the present invention and includes a bonding portion 32a, a wire bonding portion 32b, a groove 32c and a mounting terminal surface 32d. As shown in FIG. 1, the shape of the lead 32 is symmetrical with the lead 31 with respect to an axis extending in the direction y. The bonding portion 32a, the wire bonding portion 32b and the groove 32c are arranged in the region surrounded by the reflector 11 at a position shifted slightly to the right from the center in the direction x.

To the bonding portion 32a is die-bonded the LED chip 22. The wire bonding portion 32b is on the right side of the bonding portion 32a in the direction x. To this wire bonding portion are bonded an end of the wire 52 and an end of the wire 57. The other end of the wire 52 is bonded to the LED chip 22. The other end of the wire 57 is bonded to the Zener diode 42. The groove 32c is positioned between the bonding portion 32a and the wire bonding portion 32b. The shape and size of the groove 32c are the same as those of the groove 31c.

Of the lead 32, the portion projecting from the case 10 downward in the direction y in FIG. 1 is bent to extend in the direction z, as shown in FIGS. 1, 2, 4 and 5. Of this portion, the surface that faces downward in the direction y in FIG. 1 is the mounting terminal surface 32d. The bent portion extends to overlap the recess 12 of the case 10 in the direction z.

The lead 33 corresponds to the third lead defined in the present invention and includes a bonding portion 33a, a detour portion 33e and a mounting terminal surface 33d. As shown in FIG. 1, the bonding portion 33a is arranged at the center in the direction x in the region surrounded by the reflector 11. Also, the bonding portion 33a is at an upper position relative to the bonding portions 31a and 32a in the direction y in FIG. 1. To the bonding portion 33a is bonded the LED chip 23 via a conductive material.

The detour portion 33e includes a portion extending in the direction x from the bonding portion 33a to both sides, and portions extending in the direction y. The two ends of the detour portion 33e, which are spaced apart from each other in the direction x, are on the outer side of the corresponding two ends of the reflector 11 that are spaced apart in the direction x. Of the lead 33, two portions extending from the detour portion 33e project downward from the case 10 in the direction y in the figure. These portions are bent to extend in the direction z, as shown in FIGS. 1, 2, 4 and 5. Of these portions, the surfaces that face downward in the direction y in FIG. 1 are the mounting terminal surfaces 33d. Thus, the LED module of this embodiment has two mounting terminal surfaces 33d that are spaced apart from each other in the direction x. As shown in FIG. 3, both of the bent portions project from the case 10 in the direction x, as viewed in the direction z.

The lead 34 corresponds to the fourth lead of the present invention and includes a bonding portion 34a, a wire bonding portion 34b, and a mounting terminal surface 34d. As shown in FIG. 1, the bonding portion 34a and the wire bonding portion 34b are arranged in the region surrounded by the reflector 11 at a position shifted further to the left in the figure than the lead 31 in the direction x.

To the bonding portion 34a is bonded the Zener diode 41 via a conductive material. The wire bonding portion 34b is on the right side of the bonding portion 34a in the direction x and arranged side by side with the wire bonding portion 31b of the lead 31 in the direction y. To the wire bonding portion 34b is bonded an end of the wire 54. The other end of the wire 54 is bonded to the LED chip 21.

Of the lead 34, the portion projecting from the case 10 downward in the direction y in FIG. 1 is bent to extend in the direction z, as shown in FIGS. 1, 2, 4 and 5. Of this portion, the surface that faces downward in the direction y in FIG. 1 is the mounting terminal surface 34d. The bent portion extends to overlap the recess 12 of the case 10 in the direction z.

The lead 35 corresponds to the fifth lead defined in the present invention and includes a bonding portion 35a, a wire bonding portion 35b, and a mounting terminal surface 35d. As shown in FIG. 1, the shape of the lead 35 is symmetrical with the lead 34 with respect to an axis extending in the direction y. The bonding portion 35a and the wire bonding portion 35b are arranged in the region surrounded by the reflector 11 at a position shifted further to the right in the figure than the lead 32 in the direction x.

To the bonding portion 35a is bonded the Zener diode 42 via a conductive material. The wire bonding portion 35b is on the left side of the bonding portion 35a in the direction x and arranged side by side with the wire bonding portion 32b of the lead 32 in the direction y. To the wire bonding portion 35b is bonded an end of the wire 55. The other end of the wire 55 is bonded to the LED chip 22.

Of the lead 35, the portion projecting from the case 10 downward in the direction y in FIG. 1 is bent to extend in the direction z, as shown in FIGS. 1, 2, 4 and 5. Of this portion, the surface that faces downward in the direction y in FIG. 1 is the mounting terminal surface 35d. The bent portion extends to overlap the recess 12 of the case 10 in the direction z.

The lead 36 corresponds to the sixth lead defined in the present invention, and includes a wire bonding portion 36b and a mounting terminal surface 36d. As shown in FIG. 1, the bonding portion 36b is arranged at the center in the direction x in the region surrounded by the reflector 11. Also, the bonding portion 36b is at a lower position relative to the bonding portion 33a in the direction y in FIG. 1. To the wire bonding portion 36a is bonded an end of wire 53. The other end of the wire 53 is bonded to the LED chip 33.

The light-transmitting resin 60 fills the region surrounded by the reflector 11 and covers the LED chips 21, 22, 23 and the Zener diodes 41, 42. The light-transmitting resin 60 is made of e.g. transparent silicone resin.

Advantages of the LED module 100 are described below.

In this embodiment, the LED chips 21, 22 and 23 are arranged at positions corresponding to three vertexes of a triangle. This arrangement allows the three LED chips 21, 22, 23 to be positioned relatively close to each other, as compared with e.g. the case where the LED chips are arranged in a line. Thus, lights emitted from the respective LED chips can properly mix with each other, so that light emission of a bright white color is obtained. Arranging the LED chip 23 that emits red light at the center in the direction x promotes mixing of red light, blue light and green light . Moreover, the LED module 100 can be made compact by arranging the LED chips 21, 22, 23 close to each other.

The provision of the mounting terminal surfaces 31d, 32d, 33d, 34d, 35d, 36d allows individual operation of the LED chips 21, 22, 23.

The wire 53 extends from the LED chip 23 in the direction y beyond a line connecting the LED chips 21 and 22 to each other. Thus provided wire 53 hardly hinders the reduction of the distance between the LED chips 21 and 22. This is advantageous for promoting the above-described mixing of light and size reduction of the LED module 100.

The wires 51, 52, 54 and 55 are configured to extend away from the LED chip 23 in the direction x. Thus, though the LED chips 21 and 22 are of a two-wire type, no wires 51, 52, 54, 55 exist in the region surrounded by the LED chips 21, 22 and 23. This allows reduction of the distance among the LED chips 21, 22, 23. Employing a single-wire type LED chip as the LED chip 23 reduces the number of the wires existing in the region surrounded by the LED chip 21, 22 and 23.

The bonding portion 33a is arranged on the opposite side from a circuit board upon which the module is mounted. The mounting terminal surfaces 33d are spaced apart from the bonding portion in the direction y. In spite of this, the detour portion 33e connects the bonding portion 33a and each of the mounting terminal surfaces 33d properly, and substantially with no hindrance to possible arrangements of the leads 31, 32, 34, 35, 36. Advantageously, the LED module 100 can be made relatively compact in spite of the provision of a large number of mounting terminal surfaces 31d, 32d, 33d, 34d, 35d and 36d.

As shown in FIG. 6, the groove 31c functions to stop the flow of the bonding material for die-bonding the LED chip 21. Thus, the bonding material is prevented from flowing from the bonding portion 31a to the wire bonding portion 31b, which allows the bonding portion 31a and the wire bonding portion 31b to be arranged closer to each other. This is desirable for the size reduction of the LED module 100. The groove 32c similarly contributes to the size reduction of the LED module 100.

As shown in FIG. 3, owing to the provision of the recess 12, the respective reverse surfaces of the mounting terminal surfaces 31d, 32d, 34d, 35d, 36d of the leads 31, 32, 34, 35, 36 are exposed. For instance, after the LED module 100 is mounted on a circuit board or the like, some of the LED chips 21, 22, 23 may be found to be inoperable due to poor soldering. Even in such a case, since the above-described reverse surfaces are exposed, it is possible to conduct an operation for coping with the fault, such as applying a soldering iron to the poor joint portion. The projection of the reverse surfaces of the mounting terminal surfaces 33d of the lead 33 from the case 10 to each side in the direction x also allows a similar operation to be conducted.

The LED module according to the present invention is not limited to the foregoing embodiment. The specific structure of each part of the LED module according to the present invention can be varied in design in many ways.

Although the provision of the LED chip 21 that emits blue light, the LED chip 22 that emits green light and the LED chip 23 that emits red light is desirable in order for the LED module 100 to emit white light, the present invention is not limited to this, and LED chips that emit light of different wavelengths can be employed.

The invention claimed is:

1. An LED module comprising:
   a first and a second LED chips spaced apart from each other;
   a first lead including a first die bonding portion on which the first LED chip is mounted;
   a second lead including a second die bonding portion on which the second LED chip is mounted; and
   a case covering a part of each of the first lead and the second lead,
   wherein the first lead includes a first outer portion projecting from the case to an outside of the LED module, the first outer portion having a first mounting terminal surface for surface-mounting and a first reverse surface opposite to the first mounting terminal surface,
   the second lead includes a second outer portion projecting from the case to the outside of the LED module, the second outer portion having a second mounting terminal surface for surface-mounting and a second reverse surface opposite to the second mounting terminal surface,
   the case is provided with a recess that exposes at least a part of each of the first reverse surface and the second reverse surface, as viewed from a side opposite to a direction in which the first mounting terminal surface and the second mounting terminal surface face,
   the first LED chip and the second LED chip emit light in a direction parallel to the first mounting terminal surface and the second mounting terminal surface,
   the LED module further comprises a third LED chip, a third lead, a fourth lead and a diode chip mounted on the fourth lead,
   the third LED chip is disposed between the first LED chip and the second LED chip in a direction in which the first and the second LED chips are spaced apart from each other, and the third LED chip is disposed at a position spaced apart from a straight line connecting the first LED chip and the second LED chip,
   the third lead includes: a third die bonding portion on which the third LED chip is mounted; a third mounting terminal surface for surface-mounting; and a third reverse surface opposite to the third mounting terminal surface,
   as viewed in the direction in which the first mounting terminal surface and the second mounting terminal surface face, one of the first mounting terminal surface and the second mounting terminal surface is disposed between the third mounting terminal surface and the other one of the first mounting terminal surface and the second mounting terminal surface,
   the fourth lead has a first edge, a second edge and a third edge, the second edge being parallel to the first edge and facing an opposite side of the diode chip, the third edge connecting the first edge and the second edge each other, and
   the second lead comprises a protruding portion, the second edge of the fourth lead facing the protruding portion.

2. The LED module according to claim 1, wherein one of the first LED chip and the second LED chip emits blue light, the other one of the first LED chip and the second LED chip emits green light, and the third LED chip emits red light.

3. The LED module according to claim 1, wherein the third lead includes a detour portion connected to the third die bonding portion, and the detour portion extends from the third die bonding portion in the direction in which the first and the second LED chips are spaced apart, and further extends beyond one of the first LED chip and the second LED chip.

4. The LED module according to claim 1, wherein the case includes a pair of protrusions flanking the recess in the direction in which the first and the second LED chips are spaced apart from each other, and the at least a part of the third reverse surface extends from one of the pair of protrusions in the direction in which the first and the second LED chips are spaced apart from each other.

5. The LED module according to claim 1, further comprising an additional lead connected to the third LED chip, wherein the additional lead includes an additional mounting terminal surface for surface-mounting and an additional reverse surface opposite to the additional mounting terminal surface, and the recess of the case exposes at least a part of the additional reverse surface as viewed in a normal direction to the additional reverse surface.

6. The LED module according to claim 5, further comprising a wire having a first end and a second end, wherein the first end of the wire is connected to the third LED chip, and the second end of the wire is connected to the fourth lead.

7. The LED module according to claim 6, wherein the wire is arranged to intersect the straight line connecting first LED chip and the second LED chip.

8. The LED module according to claim 5, wherein the first mounting terminal surface, the second mounting terminal surface, the third mounting terminal surface and the additional mounting terminal surface are flush with each other.

9. The LED module according to claim 1, further comprising a Zener diode connected in series to the first LED chip, wherein the Zener diode is disposed opposite to the second LED chip with respect to the first LED chip in a direction in which the first and the second LED chips are spaced apart from each other.

10. The LED module according to claim 1, wherein the case includes a reflector surrounding the first LED chip and the second LED chip.

11. The LED module according to claim 10, further comprising a light-transmitting resin member filled in a space defined by the reflector, wherein the resin member covers the first LED chip and the second LED chip.

12. The LED module according to claim 1, further comprising a wire having a first end and a second end, wherein the first end of the wire is connected to the first LED chip, and the second end of the wire is connected to the first lead at a position that is farther from the second LED chip than is the first end of the wire in a direction in which the first and the second LED chips are spaced apart from each other.

13. The LED module according to claim 12, further comprising a bonding layer for connecting the first LED chip to the first lead, wherein the first lead is formed with a groove disposed between the first LED chip and the second end of the wire.

14. The LED module according to claim 13, wherein the wire bridges over the groove.

15. An LED module comprising:
a first lead having a surface;
a first LED chip mounted on the surface of the first lead;
a second lead having a surface and spaced apart from the first lead;
a second LED chip mounted on the surface of the second lead;
a third lead having a surface and spaced apart from the first lead and the second lead;
a third LED chip mounted on the surface of the third lead;
a fourth lead; and
a diode chip mounted on the fourth lead,
wherein as viewed in a normal direction to the surface of the first lead, the third lead is disposed between the first lead and the second lead,
the fourth lead has a first edge, a second edge and a third edge, the second edge being parallel to the first edge and facing an opposite side of the diode chip, the third edge connecting the first edge and the second edge each other, and
the second lead comprises a protruding portion, the second edge of the fourth lead facing the protruding portion.

16. The LED module according to claim 15, wherein one of the first LED chip and the second LED chip emits blue light, the other one of the first LED chip and the second LED chip emits green light, and the third LED chip emits red light.

17. The LED module according to claim 15, further comprising a case, wherein the case includes a frame portion that surrounds the first LED chip, the second LED chip and the third LED chip as viewed in the normal direction to the surface of the first lead.

18. The LED module according to claim 17, wherein each of the first lead and the second lead includes a portion crossing the frame portion of the case as viewed in the normal direction to the surface of the first lead.

19. The LED module according to claim 15, wherein the first LED chip is electrically connected to the first lead.

20. The LED module according to claim 15, wherein the second LED chip is electrically connected to the second lead.

* * * * *